United States Patent [19]

Latham, II

[11] Patent Number: 4,636,748
[45] Date of Patent: Jan. 13, 1987

[54] CHARGE PUMP FOR USE IN A PHASE-LOCKED LOOP

[75] Inventor: Paul W. Latham, II, Marlboro, Mass.

[73] Assignee: Data General Corporation, Westborough, Mass.

[21] Appl. No.: 749,156

[22] Filed: Jun. 26, 1985

[51] Int. Cl.[4] .............................................. H03L 7/00
[52] U.S. Cl. ........................................ 331/17; 331/8; 331/25; 331/111
[58] Field of Search ..................... 331/1 A, 8, 17, 25, 331/111, 113 R; 328/133, 134, 155; 307/511, 514, 516

[56] References Cited

U.S. PATENT DOCUMENTS 4,546,330 10/1985 Okada .............................. 331/25 X

OTHER PUBLICATIONS

Motorola Detector MC4344/4044 paper, pp. 1–20, 1972.

Primary Examiner—Eugene R. LaRoche
Assistant Examiner—Robert J. Pascal
Attorney, Agent, or Firm—Gerald Cechony

[57] ABSTRACT

An improved charge pump for use in a phase-locked loop is disclosed in which there is only one current source, and in which all switching components pass current in the same direction. The charge pump may thus be constructed entirely of NPN transistors, which makes it possible to embody it in a single integrated circuit chip. The pump up and pump down currents inherently have the same magnitude and transient characteristics, thus minimizing steady-state errors.

10 Claims, 4 Drawing Figures

CHARGE PUMP FOR USE IN A PHASE-LOCKED LOOP

BACKGROUND OF THE INVENTION

1. Cross-Reference to Related Applications:

This application is related to the U.S. patent application Ser. No. 749-155 entitled "Improving Diode Switching Speed", in the name of common inventor, assigned to common assignee, and filed of even date herewith.

2. Field of the Invention:

This invention relates to servosystems, particularly to Type II phase-locked loops, and more particularly to charge pumps for use in Type II phase-locked loops.

3. Description of the Prior Art:

References:

Charge-Pump Phase-Lock Loops, Floyd M. Gardner, IEEE Transactions on Communications, Vol. COM 28, No. 11, November 1980, p. 1849 et seq., IEEE publication number 0090-6778/80/1100-1849. (Hereinafter, "Gardner".)

Analysis and Design of Analog Integrated Circuits, Paul R. Gray and Robert G. Meyer, John Wiley & Sons, ISBN 0-471-01367-6. (Hereinafter, "Gray")

In many applications it is desirable to synchronize a generated signal with a reference signal. Type 0 and Type I servosystems are often used for frequency synchronization. In such applications as high density data processing apparatus where clock signals must be closely synchronized with data signals in order to achieve accurate data readout, the phase as well as the frequency of the two signals must be synchronized; Type II phase-locked loops are widely used for this purpose.

The Type II phase-locked loop typically includes a voltage-controlled oscillator (VCO) for generating the clock signal at a frequency which is some function of a control voltage. Adjustments to the frequency and phase of the clock signal may then be effected by adjusting the control voltage. The Type II phase-locked loop typically includes a circuit for detecting a phase difference between the clock signal and the data signal, and provision for adjusting the control voltage by an amount proportional to that phase difference. The provision for adjusting the control voltage typically includes a "charge pump" or "current pump" for generating a positive and a negative pulse of current (the "UP" current and the "DOWN" current), the difference between the integrals of which is proportional to the detected phase difference; a capacitor for integrating the current pulses; and a low-pass filter and compensation network for adjusting the control voltage by some function of the integral.

The ideal charge pump would exhibit these characteristics:

(1) the UP current and the DOWN current are equal in amplitude;
(2) the transient characteristics of the UP and DOWN currents are symmetrical;
(3) during times when the charge pump is not being commanded to produce current output, its output is precisely zero.

Prior-art charge pumps have utilized two complementary current sources, one for the UP current and one for the DOWN current. (See, for example, Gardner at FIGS. 2 and 6, and U.S. Pat. No. 3,701,039, Lang et al.) Since the currents originate from different sources and are passed through different switching circuits, it is difficult to satisfy conditions (1) and (2). A solid-state implementation necessitates that one source be implemented with NPN semiconductors and the other with PNP, exacerbating these difficulties. (It may be quite difficult to obtain a PNP transistor displaying characteristics exactly complementary to those of a given NPN transistor, or vice versa.) The problems are further compounded if it is attempted to implement the charge pump as an integrated circuit, which is desirable in view of the space and economic efficiencies and the higher reliability provided by integrated circuits—PNP transistors that are realizable in present-day integrated circuit technology are grossly inferior to the NPN transistors attainable. (See Gray at Section 2.4.2, pp 91 et seq.)

SUMMARY OF THE INVENTION

The present invention provides a differential charge pump utilizing a single current source and two identical current switching paths. The current output thus inherently has the same magnitude and similar transient characteristics for pump-up and pump-down currents. The charge pump is realizable using only one type of semiconductors; they can be NPN semiconductors, facilitating construction of the charge pump in a single integrated circuit.

It is thus a general object of the present invention to provide an improved charge pump for use in phase-locked loops.

It is another object of the present invention to provide a charge pump which provides UP and DOWN currents of equal amplitude and with symmetric transient characteristics.

It is yet another object of the present invention to provide an improved charge pump which can be implemented in an integrated circuit.

Other objects and advantages of the present invention will be apparent to those skilled in the art, after referring to the description of the preferred embodiment and the appended drawings.

IN THE DRAWINGS

DETAILED DESCRIPTION

Prior Art

Figure 1:
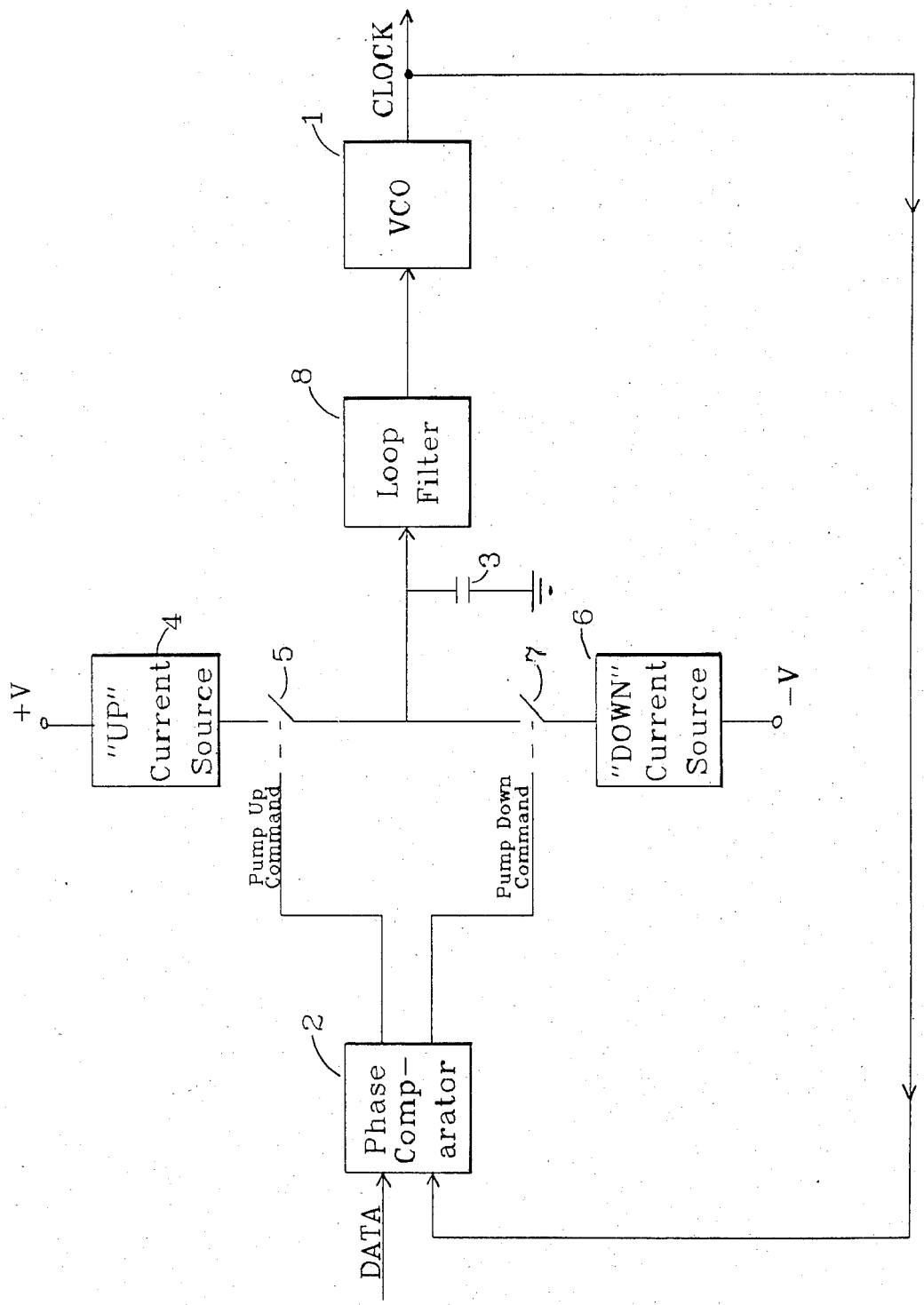
FIG. 1 depicts a phase-locked loop of the prior art.

FIG. 1 shows a phase-locked loop of the prior art. VCO (voltage-controlled oscillator) 1 produces a CLOCK signal which is periodic at a frequency proportional to the voltage at the input of VCO 1 (the "control voltage"). The CLOCK signal is fed back as an input to phase comparator 2, along with a DATA signal with which it is desired to synchronize the frequency and phase of the CLOCK signal. The output of phase comparator 2 consists of two non-congruent digital signals: PUMP UP and PUMP DOWN. If the DATA and CLOCK signals are synchronized, the UP and DOWN signals are of equal duration; otherwise, there will be a difference in their length proportional to the difference in phase between the DATA and CLOCK signals. The PUMP UP command causes switch 5 to close, allowing current to flow from UP current source 4 to charge integrating capacitor 3. Similarly, the PUMP DOWN command closes switch 7, allowing current to flow from DOWN current source 6, discharging capacitor 3. It is apparent that capacitor 3 integrates the two currents; since they flow in opposite directions relative to capacitor 3, the integral will be zero if the two currents were of the same duration (assuming the two currents to have the same magnitude and transient characteristics). If they were not of the same duration, the integral would be non-zero, effecting a change in the voltage to which capacitor 3 is charged. The voltage on capacitor 3, as filtered by loop filter 8, is the control voltage. (Loop filter 8 employs control theory considerations to form VCO 1's control voltage from the voltage on capacitor 3, thus providing loop stability. See Gardner.) Thus, phase differences detected by phase comparator 2 are used to alter the control voltage in a manner that alters the frequency of the CLOCK signal so as to compensate for those phase differences.

Ideally, when the DATA and CLOCK signals are perfectly synchronized, the steady-state error should be zero; i.e., the voltage across integrating capacitor 3 should not change. That is to say that the integral of the UP current should be precisely equal to minus the integral of the DOWN current. This is difficult to achieve in the prior art since, as previously discussed, there are two current sources and two separate switching paths implemented in different types of semiconductors, and so a precise match of current amplitudes and transient characteristics is precluded.

THE PRESENT INVENTION

Figure 2:
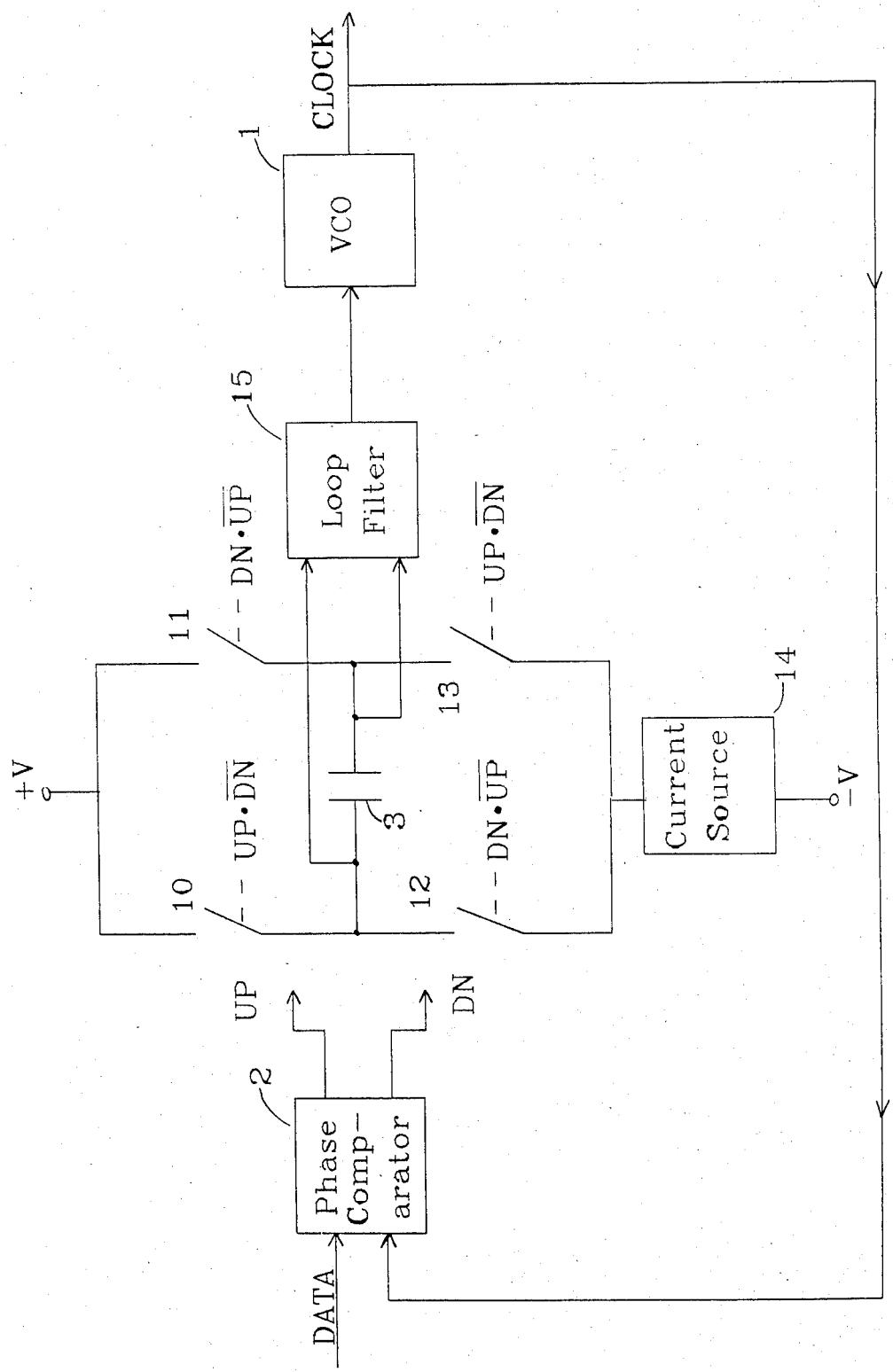
FIG. 2 depicts a phase-locked loop employing the charge pump of the present invention.

The present invention overcomes these drawbacks of the prior art by providing a current pump consisting of a single current source and identical switching paths. It can be implemented using only one type of semiconductors. FIG. 2 is a block diagram of a phase-locked loop embodying the improved current pump. VCO 1 and phase comparator 2 may be as in the prior art. Integrating capacitor 3 is connected across a bridge, each leg of which contains a switch. The PUMP UP command causes switches 10 and 13 to close, completing a current path for current determined by current source 14 to flow in such direction as to charge capacitor 3. The PUMP DOWN command closes switches 11 and 12, completing the path for the source current to flow in such a direction as to discharge capacitor 3. Loop filter 15 is functionally equivalent to loop filter 8 of the prior art except for having differential instead of single-ended input, with integrating capacitor 3 connected across that differential input.

Prior art difficulties of matching the characteristics of two current sources are eliminated by providing a single current source for both the PUMP UP and PUMP DOWN currents. Difficulties of matching the transient responses of different switching paths are minimized by providing switches that all must pass current in the same direction; they can thus be identical and constructed of the same semiconductor types. Means are provided for controlling the biasing voltages on switching diodes so as to minimize their switching times.

DETAILED DESCRIPTION OF THE PREFERRED EMBODIMENT

Figure 3:
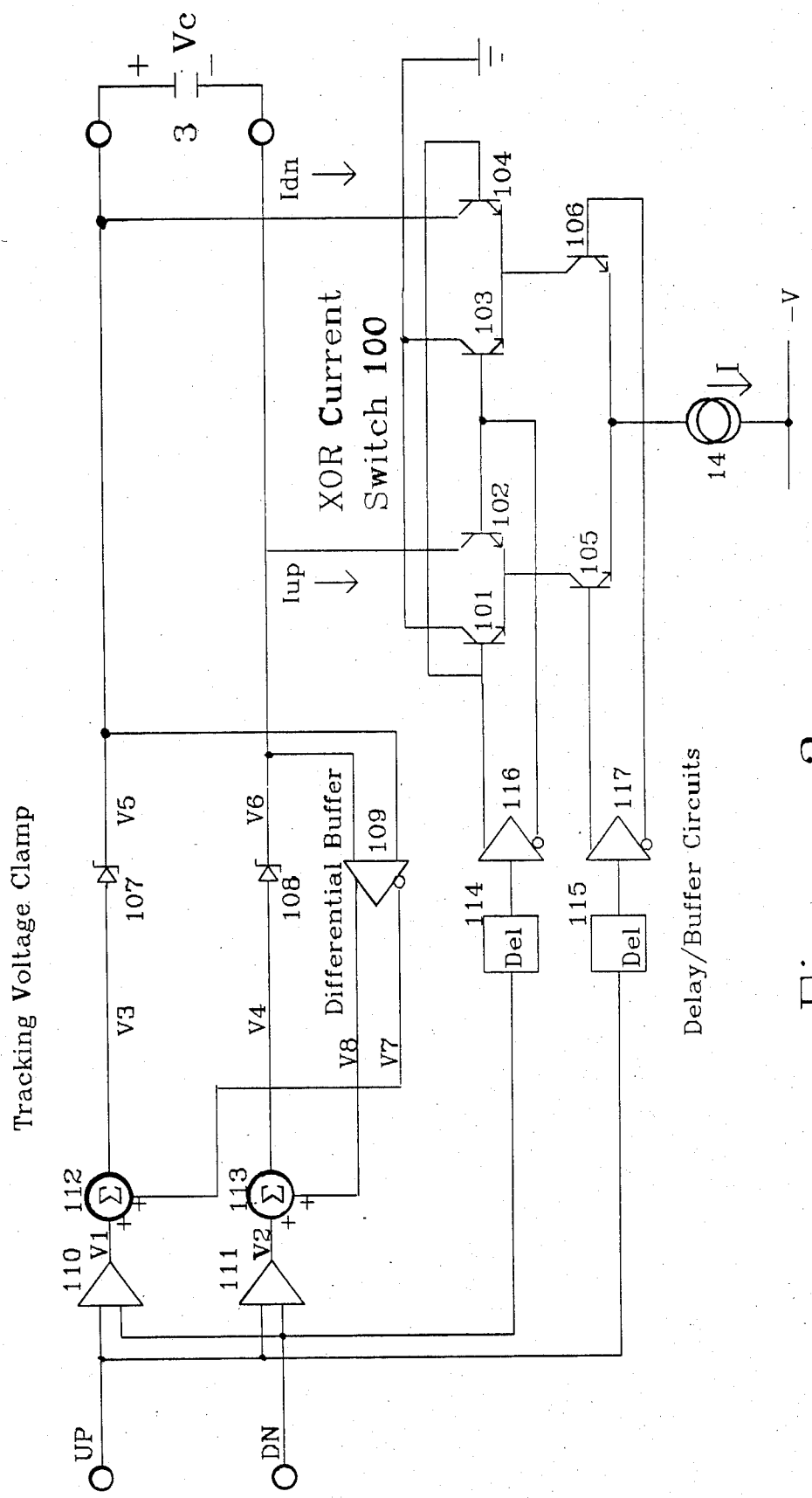
FIG. 3 is a block diagram of the charge pump of the present invention.

FIG. 3 is a block diagram of the improved charge pump of the present invention. Current source 14 and capacitor 3 both appear in FIG. 3. Current switches 12 and 13 of FIG. 2 are expanded in FIG. 3 to exclusive-OR switch 100 comprising transistors 101 through 106. ("Up" switch 12 is expanded to transistors 102 and 105, while "down" switch 13 is expanded to transistors 104 and 106. Transistors 101 and 103 are provided to sink the source current to ground when neither up nor down current is called for, thus keeping a constant load on current source 14.) The function of voltage switches 10 and 11 of FIG. 2 is performed by clamping diodes 107 and 108. Amplifiers 110 and 111, summers 112 and 113, and differential buffer 109 are provided to actuate and speed up clamping diodes 107 and 108, as will be described below. Delays 114 and 115 are provided to ensure that the exclusive-OR current switch does not respond to the UP and DN commands until clamping diodes 107 and 108 have stabilized in their responses. Buffers 116 and 117 provide signals of the proper polarity to actuate the exclusive-OR current switch.

Voltage clamp:

If capacitor 3 is to be pumped "up", the voltage source for current source 14 (switched through the exclusive-OR current switch to be described below) will be through clamping diode 107. If capacitor 3 is to be pumped "down", the voltage source will be through clamping diode 108.

To minimize the slewing time of clamping diodes 107 and 108, the voltage shifts they undergo are just sufficient to forward- or back-bias them as needed. Amplifiers 110 and 111 output V1 and V2 respectively, which can take values of either zero volts, one-half Vd (the diode junction voltage), or minus one-half Vd, depending on the states of the UP and DN inputs, as summarized in Table 1.

Differential buffer 109 keeps the same voltage difference between its two output lines as exists between its two input lines, but shifts the voltage reference so that the output lines are more positive than the input lines by an amount equal to Vd/2, where Vd is the junction voltage of diodes 107 and 108. Since the differential buffer 109 inputs are connected across capacitor 3, the voltage across which is Vc, the outputs are separated by a potential equal to Vc.

Since capacitor 3 is used differentially and does not have either of its terminals referenced to ground, the voltage across it is said to be referenced to "Vbias". (If capacitor 3, having capacitance "C", were replaced by two capacitors in series, each having capacitance 2C, Vbias would be the voltage appearing between the two capacitors.) The value of Vbias is determined within differential buffer 109; its value is not critical to the operation of the charge pump. V5, the voltage on capacitor 3's positive terminal, then has a value of Vbias+Vc/2; similarly, V6, the voltage on its negative terminal, has a value of Vbias−Vc/2. Regarding the outputs of differential buffer 109, then, V7's value is Vbias+Vc/2+Vd/2; V8's value is Vbias−Vc/2+Vd/2. (See Table 1.)

Summer 112 adds V1 and V7 to produce V3; summer 113 adds V2 and V8 to produce V4. (See Table 1.)

TABLE 1

| UP | DN | V1 | V2 | V3 | V4 | DIODES FORWARD-BIASED |
|----|----|----|----|----|----|----|
| 0 | 0 | 0 | 0 | V5 + Vd/2 | V6 + Vd/2 | NEITHER |
| 0 | 1 | −Vd/2 | +Vd/2 | V5 + Vd | V6 | 107 |
| 1 | 0 | +Vd/2 | −Vd/2 | V5 | V6 + Vd | 108 |

TABLE 1-continued

| UP | DN | V1 | V2 | V3 | V4 | DIODES FORWARD-BIASED |
|---|---|---|---|---|---|---|
| 1 | 1 | 0 | 0 | V5 + Vd/2 | V6 + Vd/2 | NEITHER |

NOTES:
Vd = diode junction voltage
V5 = Vbias + Vc/2
V6 = Vbias − Vc/2
V7 = V5 + Vd/2
V8 = V6 + Vd/2

Figure 4:
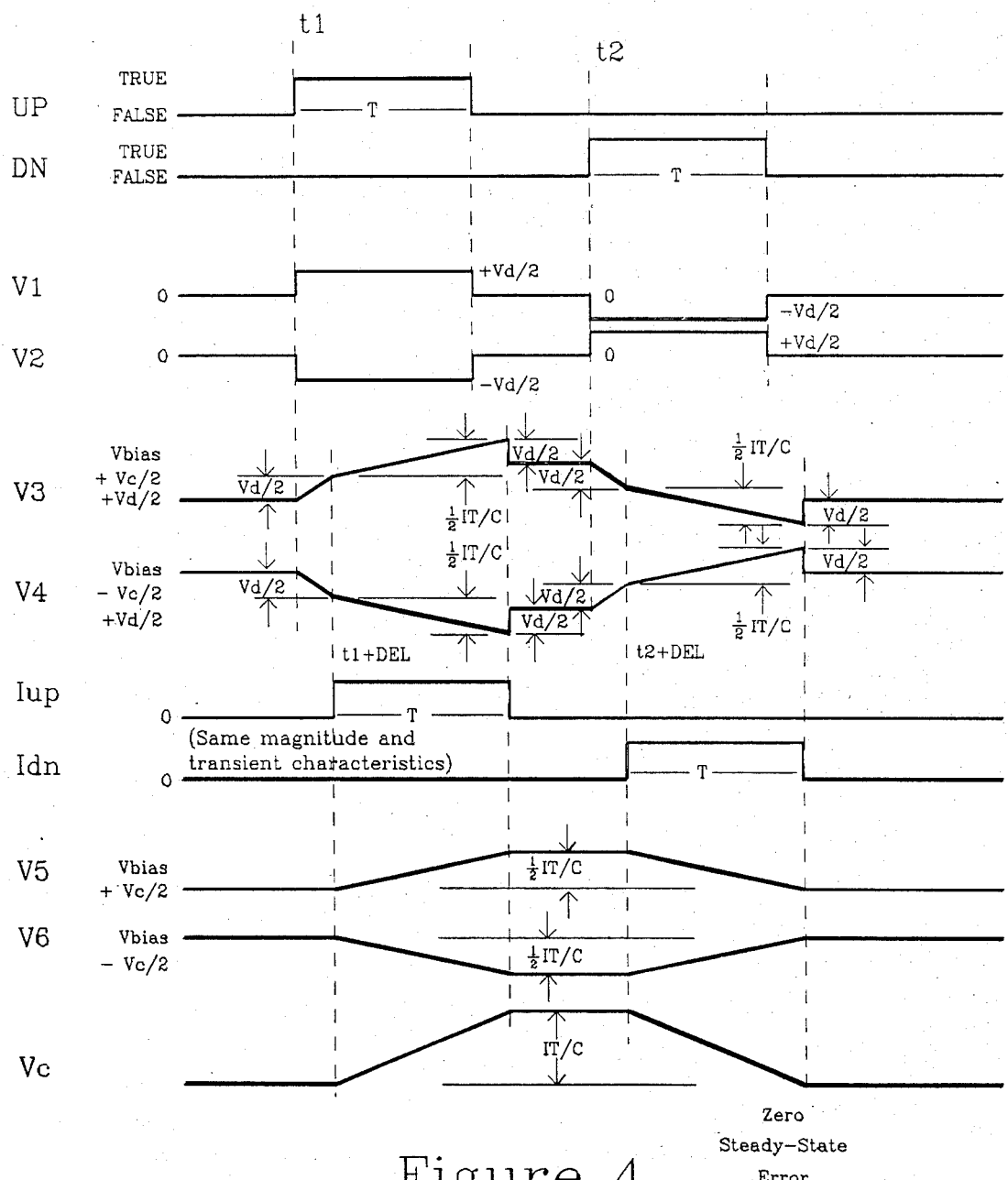
FIG. 4 is a timing diagram of the charge pump of the present invention.

FIG. 4, which depicts certain timing waveforms within the circuit, should now be consulted along with FIG. 3 and Table 1. Prior to time t1, the UP and DN commands are both false, and therefore V1 and V2 both have values of zero volts. V4 is thus equal to V8, which in turn is greater by Vd/2 than V6. Diode 108's anode voltage (V4), then, is greater than its cathode voltage (V6) by half its junction voltage. This is not sufficient to forward-bias diode 108; the anode voltage must be greater than the cathode voltage by at least the full junction voltage for forward biasing to occur. By similar analysis, diode 107 is also back-biased at this time. It is thus shown that the voltage clamping switches are, in effect, open when the UP and DN commands are both false. By similar reasoning, they would also both be open if UP and DN were both true, although this condition is not permitted to occur in the present embodiment.

Referring to FIG. 4, the UP command is assumed to become true at time t1. V1 then takes a value of +Vd/2. Summer 112 adds this to V3, which increases diode 107's anode voltage (V3) to a value which is greater than the cathode voltage (V6) by Vd, the junction voltage. This is sufficient to forward-bias diode 107. At the same time, V2 goes to −Vd/2. Summer 111 adds this negative value to V4, lowering diode 108's anode voltage and keeping it back-biased. The current path is thus permissive for UP current from the XOR current switch (to be discussed below) to flow through capacitor 3 in such a direction as to charge it, and to flow through diode 107. As FIG. 4 shows, this charging alters the magnitudes of the voltages at the circuit points being discussed. As the voltage across capacitor 3 (and thus the cathode voltages of diodes 107 and 108) is slewed, differential buffer 109 adjusts the anode voltages commensurately, thus maintaining the aforementioned conditions of forward-and back-biasing.

Referring again to FIG. 4, the UP command goes false after time T, and there is then a period where UP and DN are both false. As discussed above, this results in back-biasing both diode 107 and diode 108.

The DN command becomes true at time t2. V1 then goes to −Vd/2, and V2 goes to +Vd/2. By reasoning similar to that employed in conjunction with the UP command, it is apparent that diode 107 is back-biased and diode 108 is forward biased. This provides a current path for DN current from the XOR current switch (to be discussed below) to flow through capacitor 3 in such direction as to discharge it, and to flow through diode 108. Again, the magnitudes of the voltages at the circuit nodes being discussed slew to different values, as shown in FIG. 4. Exclusive-OR Current Switch:

Delays 114 and 115 delay the UP and DN commands to allow time for clamping diodes 107 and 108 to stabilize in the conditions described above. (Since the delay times required are quite short, about 1.5 nanoseconds, delays 114 and 115 consist simply of transistor stages, the delay time being essentially the turn-on time of the transistors.) The delayed outputs are $UP_D$ and $DN_D$ respectively, which are input to buffers 116 and 117 respectively. If the DN command is TRUE, the non-inverted output of buffer 116 turns on transistors 101 and 104, while the inverted output turns off transistors 102 and 103. The FALSE state of DN will accomplish the inverse of this.

If the UP command is TRUE, the non-inverted output of buffer 117 turns on transistor 105 while the inverted output turns off transistor 106. The FALSE state of UP will cause transistor 106 to be on and 105 to be off.

The foregoing analysis is represented in tabular form in Table 2, showing the states of transistors 101 through 106 for the four possible states of the UP and DN commands.

TABLE 2

| UP | DN | 101 | 102 | 103 | 104 | 105 | 106 |
|---|---|---|---|---|---|---|---|
| 0 | 0 | — | ON | ON | — | — | ON |
| 0 | 1 | ON | — | — | ON | — | ON |
| 1 | 0 | — | ON | ON | — | ON | — |
| 1 | 1 | ON | — | — | ON | ON | — |

Combined Operation:

In view of the foregoing analyses of the voltage clamp and the exclusive-OR current switch, it is apparent that the overall functional operation of FIG. 3 is that summarized in Table 3.

TABLE 3

| UP | DN | CURRENT PATH |
|---|---|---|
| 0 | 0 | 14 - 106 - 103 - ground |
| 0 | 1 | 14 - 106 - 104 - 3 - 108 (discharges 3) |
| 1 | 0 | 14 - 105 - 102 - 3 - 107 (charges 3) |
| 1 | 1 | 14 - 105 - 101 - ground |

As FIG. 4 shows, every occurrence of current I for duration T slews the voltage on capacitor 3 by IT/C. The foregoing discussion has assumed steady-state operation, i e., that the CLOCK and DATA signals are synchronized and no adjustments are to be made in the frequency of CLOCK. As in the prior art, adjustments in the frequency of CLOCK could be made by allowing the UP current and the DOWN current to flow for differing amounts of time, resulting in slewing the voltage up by a different amount than that by which it is slewed down, effecting a net change in the capacitor voltage which in turn effects a change in VCO 1's control voltage.

When the UP and DN commands are both true or both false, the current through capacitor 3 should ideally be absolutely zero. In practice, that current will be the leakage current from the XOR current switch through diodes 107 or 108. The leakage current is extremely small, since it must flow through transistors 102 or 104 and then through diodes 107 or 108; transistors 102 and 104 are turned off at this time, and furthermore are shunted by transistors 101 and 103 respectively, one of which is turned on and conductive to ground at this time; diodes 107 and 108 are back-biased at this time.

It is apparent that there is but one current source, which facilitates the symmetry of the up and down currents. Since current flows in the same direction in both sides of the voltage clamping network and in both sides of the exclusive-OR current switch, all transistors can be NPN transistors.

The invention may be embodied in yet other specific forms without departing from the spirit or essential characteristics thereof. Thus, the present embodiment is to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A charge pump responsive to first and second commands for effecting in a current integrating means a change in voltage proportional to a difference in duration between the first and second commands, the charge pump comprising:
   a current source for producing a source current;
   a first switching means responsive to the first command for passing the source current through the integrating means in a first direction; and
   a second switching means responsive to the second command for passing the source current through the integrating means in a second direction opposite to the first direction.

2. A charge pump responsive to first and second commands for effecting in a current integrating means a change in voltage proportional to a difference in duration between the first and second commands, the charge pump comprising:
   a current source for producing a source current;
   a first switching means connected between the current source and the current integrating means and responsive to the first command for passing the source current to the current integrating means as a first current in a first direction;
   a second switching means responsive to the first command for completing a first current path for the first current from the current integrating means;
   a third switching means connected between the current source and the current integrating means and responsive to the second command for passing the source current to the current integrating means as a second current in a second direction opposite to the first direction; and
   a fourth switching means responsive to the second command for completing a second current path for the second current from the current integrating means.

3. The charge pump recited in claim 2, wherein:
   the first and third switching means pass the source current to a circuit ground when the first and second commands are simultaneously true.

4. The charge pump recited in claim 2, wherein:
   the first and third switching means pass the source current to a circuit ground when the first and second commands are simultaneously false.

5. The charge pump recited in claim 2, wherein:
   the charge pump is configured as a bridge circuit;
   the first, second, third, and fourth switching means each comprise one leg of the bridge circuit; and
   the current integrating means comprises a capacitor connected across the bridge circuit.

6. In a phase-locked loop comprising
   a voltage-controlled oscillator (VCO) responsive to a control voltage for producing a first signal which is periodic at a frequency proportional to the control voltage;
   means for detecting a phase difference between the first signal and a reference signal, and for producing first and second commands, a difference between whose durations is proportional to the phase difference;
   a charge pump responsive to the phase difference detecting means for producing a first current and a second current, a sum of the integrals of which is proportional to the difference between the durations of the first and second commands; and
   adjusting means including current integrating means responsive to the first current and the second current for adjusting the control voltage by an amount proportional to the sum of the integrals of the first current and the second current;
   the charge pump comprising
   a current source for producing a source current;
   a first switching means responsive to the first command for passing the source current through the current integrating means as a first current in a first direction;
   a second switching means responsive to the second command for passing the source current through the current integrating means as a second current in a second direction opposite to the first direction.

7. In a phase-locked loop comprising
   a voltage-controlled oscillator (VCO) responsive to a control voltage for producing a first signal which is periodic at a frequency proportional to the control voltage;
   means for detecting a phase difference between the first signal and a reference signal, and for producing first and second commands, a difference between whose durations is proportional to the phase difference;
   a charge pump responsive to the phase difference detecting means for producing a first current and a second current, a sum of the integrals of which is proportional to the difference between the durations of the first and second commands; and
   adjusting means including current integrating means responsive to the first current and the second current for adjusting the control voltage by an amount proportional to the sum of the integrals of the first current and the second current;
   the charge pump comprising
   a current source for producing a source current;
   a first switching means connected between the current source and the current integrating means and responsive to the first command for passing the source current to the current integrating means as a first current in a first direction;
   a second switching means responsive to the first command for completing a first current path for the first current from the current integrating means;
   a third switching means connected between the current source and the current integrating means and responsive to the second command for passing the source current to the current integrating means as a second current in a second direction opposite to the first direction; and
   a fourth switching means responsive to the second command for completing a second current path for the second current from the current integrating means.

8. The phase-locked loop recited in claim 7, wherein:
   the first and third switching means pass the source current to a circuit ground when the first and second commands are simultaneously true.

9. The phase-locked loop recited in claim 7, wherein:

the first and third switching means pass the source current to a circuit ground when the first and second commands are simultaneously false.

10. The phase-locked loop recited in claim 7, wherein:

the charge pump is configured as a bridge circuit;
the first, second, third, and fourth switching means each comprise one leg of the bridge circuit; and
the current integrating means comprises a capacitor connected across the bridge circuit.

* * * * *